United States Patent
Chaki

(10) Patent No.: US 6,605,871 B2
(45) Date of Patent: Aug. 12, 2003

(54) RF CIRCUIT CHIP AND RF CIRCUIT DEVICE INCLUDING THE RF CIRCUIT CHIP

(75) Inventor: Shin Chaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/960,493

(22) Filed: Sep. 24, 2001

(65) Prior Publication Data

US 2002/0167083 A1 Nov. 14, 2002

(30) Foreign Application Priority Data

May 8, 2001 (JP) .......................................... 2001-137421

(51) Int. Cl.[7] .......................... H01L 23/48; H01L 27/06; H01L 29/40; B32B 31/00
(52) U.S. Cl. ........................ 257/728; 257/696; 257/698; 257/691; 257/724; 257/725; 257/208; 257/275; 257/784
(58) Field of Search ................................. 257/728, 691, 257/725, 698, 696, 690, 784, 786, 724, 208, 275

(56) References Cited

U.S. PATENT DOCUMENTS

| | | | | |
|---|---|---|---|---|
| 5,376,909 A | * | 12/1994 | Nelson et al. | ............... 257/728 |
| 5,777,528 A | * | 7/1998 | Schumacher et al. | .......... 333/33 |
| 6,285,324 B1 | * | 9/2001 | Korisch et al. | ....... 343/700 MS |
| 6,331,931 B1 | * | 12/2001 | Titizian et al. | ............ 361/306.3 |
| 6,351,192 B1 | * | 2/2002 | Sheen | .......................... 333/26 |

FOREIGN PATENT DOCUMENTS

JP        60-9235      1/1985

* cited by examiner

*Primary Examiner*—Alexander O. Williams
(74) *Attorney, Agent, or Firm*—Leydig, Voit & Mayer, Ltd.

(57) ABSTRACT

To eliminate variations in measurement of the chip characteristics an MMIC chip has a pad main portion having the same width as a main line at an end of the main line The main line is located on a GaAs substrate. Pad auxiliary islands are adjacent to the pad main portion on one or both sides. A grounding wiring layer is on at least one side of the pad main portion with the pad auxiliary island interposed in between. The pad main portion and the pad auxiliary portions secure a sufficient bonding area. The electrical characteristics are measured by bringing probes into contact with the pad main portion and the grounding wiring layer(s). The electrical characteristics of the MMIC chip can be evaluated without an increase in bonding pad capacitance.

5 Claims, 8 Drawing Sheets

(i) w1=150 μm    w2=70 μm
(g=0 μm)

(ii) w1=150 μm   w2=70 μm
g=5,10,15,20 μm (iii) w1=70 μm   w2=70 μm
(w1=150 μm  g=40 μm )

RF CIRCUIT CHIP AND RF CIRCUIT DEVICE INCLUDING THE RF CIRCUIT CHIP

BACKGROUND OF THE INVENTION

1. Field of the Invention

The present invention relates to an RF circuit chip, an RF circuit device having the chip, and their manufacturing method. In particular, the invention relates to a shape of pads to which wires are to be connected.

2. Background Art

With the spread of portable terminal equipment, the demand for portable terminal equipment that is inexpensive and has superior RF characteristics has increased.

To decrease the size and weight of portable terminal equipment, MMICs (Monolithic Microwave ICs) are widely used as RF semiconductor chips for portable terminal equipment. MMICs are used as part of an RF semiconductor device such as a module or a package.

When an MMIC is mounted in a module, a package, or the like, the MMIC is die-bonded to a mounting substrate of the module, package, or the like, and the pads that are formed on wiring layers on the MMIC are connected to wiring layers of the module, package, or the like by using wires.

In particular, as for wires to be connected to pads (RF pads) through which an RF signal is to travel, in many cases a plurality of wires are connected to each pad and arranged parallel to each other to decrease the influence of the inductance of the wires on the RF characteristics in the RE range.

Therefore, to secure sufficient wire bonding areas, maintain the mechanical strength and the electrical characteristics of the bonding, and keep the bonding reliable, it is necessary that the width of RF pads on the MMIC be greater than that of main lines for a signal.

FIG. 14 is a plan view of part of a conventional MMIC chip.

In FIG. 14, reference numeral 100 denotes an MMIC chip; 102, a GaAs substrate; 104, a main line; 106, an RF pad; and 108, via holes that are connected to a back-surface grounding conductor. Reference numeral 110 denotes grounding pads that are grounded via the respective via holes 108.

For example, if the thickness of the GaAs substrate 102 is 100 μm, it is necessary that the width of the main line 104 having a characteristic impedance of 50Ω be set at about 70 μm and the width of the RF pad 106 be greater than the width of the main line 104 and be set at about 150 μm, for example. Although the characteristic impedance 50Ω of the main line 104 is secured in this manner, in a particularly high frequency range, for example, the millimetric wave band where the frequency exceeds 60 GHz, the parallel parasitic capacitance of the RF pad 106 that is wider than the main line 104 is not negligible any more and the impedance becomes smaller than 50Ω, as a result of which the RF characteristics are deteriorated.

FIG. 15 is a schematic diagram showing how the RF characteristics of the conventional MMIC chip 100 are measured.

In FIG. 15, reference numeral 112 denotes a probe head and numeral 114 denotes probes that are attached to the probe head 112.

As shown in FIG. 15, the RF characteristics of the conventional MMIC chip 100 are measured and evaluated in a state that no wires are connected to it. If the RF characteristics are recognized at the designing stage with an assumption that the RF pad 106 has the same width as the main line 104, measurement results that are obtained in producing the MMIC chip 100 should be different from the RF characteristics recognized at the designing stage and the MMIC chip 100 may be judged defective.

FIG. 16 is a plan view of part of a module in which the conventional MMIC chip 100 is mounted.

In FIG. 16, reference numeral 116 denotes a module; 118, an alumina substrate; 120, a wiring layer formed on the alumina substrate 118; 122, a pad; and 124, bonding wires that connect the RF pad 106 of the MMIC chip 100 to the pad 122 on the alumina substrate 118 of the module 116.

As shown in FIG. 16, in a state that the pad 122 is connected to the RF pad 106 by the bonding wires 124, the inductance of the bonding wires 124 in the mounted state and a capacitance increase due to the increased pad width of the chip 100 partly cancel out each other and hence the RE characteristics of the mounted MMIC chip 100 would come closer to those of the MMIC 100 at the designing stage than those obtained in producing the MMIC chip 100. However, discrimination between good products and defective products is made based on evaluation results obtained in producing the MMIC chip 100, so a problem arises that an unduly large number of defective products occur.

If the RF characteristics are evaluated at the designing stage with an assumption that the pad width is greater than the line width, measurement results of the RF characteristics obtained in producing the chip 100 should coincide with the RF characteristics at the designing stage. However, the inductance of the bonding wires 124 directly influences the RF characteristics in the chip-mounted state in which the bonding wires 124 are connected to the pad 122 and the RF pad 106 and hence a problem arises that the RF characteristics obtained in the chip-mounted state no longer coincide with those at the designing stage.

If the evaluation at the designing stage is performed in a state that the bonding wires 124 are connected to the pad 122 and the RF pad 106, it is difficult to determine the RE characteristics at the designing stage because the inductance of the bonding wires 124 varies depending on their mounting states. Further, measurement results of the RE characteristics obtained in producing the chip 100 (bonding wires 124 are not connected to the pad 122 and the RE pad 106) may not coincide with the RE characteristics at the designing stage. An unduly large number of defective products may occur.

SUMMARY OF THE INVENTION

The present invention has been made to solve the above problems in the art, and a first object of the invention is therefore to provide an RF circuit chip in which variations in electrical characteristics are small by virtue of small differences in the chip electrical characteristics such as the RF characteristics at the designing stage, chip evaluation stage, and chip mounting stage while sufficient wire bonding areas are secured. A second object of the invention is to provide an RF circuit device that can be produced at a high yield and is inexpensive and highly reliable. A third object of the invention is to provide a manufacturing method capable of properly discriminating between good products and defective products by evaluating the chip RF characteristics according to the same specification as at the designing stage. A fourth object of the invention is to provide a manufacturing method capable of manufacturing, by a simple process, an RF circuit device that can be produced at a high yield and is inexpensive and highly reliable.

According to one aspect of the present invention, an RF circuit chip comprises: a first wiring layer provided on a substrate and having an end portion; first and second conductor films provided in an island-like manner adjacent to the end portion of the first wiring layer on one or both sides thereof; and a grounding conductor film provided on at least one side of the end portion with at least one of the first and second conductor films interposed in between.

According to another aspect of the present invention, an RF circuit chip comprises first wiring layers provided on a substrate so as to extend parallel with each other with a prescribed interval formed in between and having respective end portions that are adjacent to each other with an interval formed in between.

According to another aspect of the present invention, an RF circuit device comprises a dielectric substrate; an RF circuit chip provided on the dielectric substrate, the RF circuit chip comprising: a first wiring layer provided on a substrate and having an end portion; first and second conductor films provided in an island-like manner adjacent to the end portion of the first wiring layer on one or both sides thereof; and a grounding conductor film provided on at least one side of the end portion with at least one of the first and second conductor films interposed in between. The RF circuit device further comprises; a second wiring layer provided on the dielectric substrate; a first connection conductor having a first end and a second end, the first end being connected to the end portion of the first wiring layer of the RF circuit chip and the first conductor film so as to bridge those, the second end being connected to the second wiring layer; and a second connection conductor having a first end and a second end, the first end being connected to the end portion of the first wiring layer of the RF circuit chip and the second conductor film so as to bridge those, the second end being connected to the second wiring layer.

According to another aspect of the present invention, an RF circuit device comprises: a dielectric substrate; an RF circuit chip provided on the dielectric substrate and comprising first wiring layers provided on a substrate so as to extend parallel with each other with a prescribed interval formed in between and having respective end portions that are adjacent to each other with an interval formed in between; a second wiring layer provided on the dielectric substrate and to be supplied with a DC bias voltage; and a third connection conductor having a first end and a second end, the first end being connected to the end portions of the first wiring layers of the RF circuit chip so as to bridge those, the second end being connected to the second wiring layer.

Other and further objects, features and advantages of the invention will appear more fully from the following description.

DETAILED DESCRIPTION OF THE PREFERRED EMBODIMENTS

First Embodiment

Figure 1:
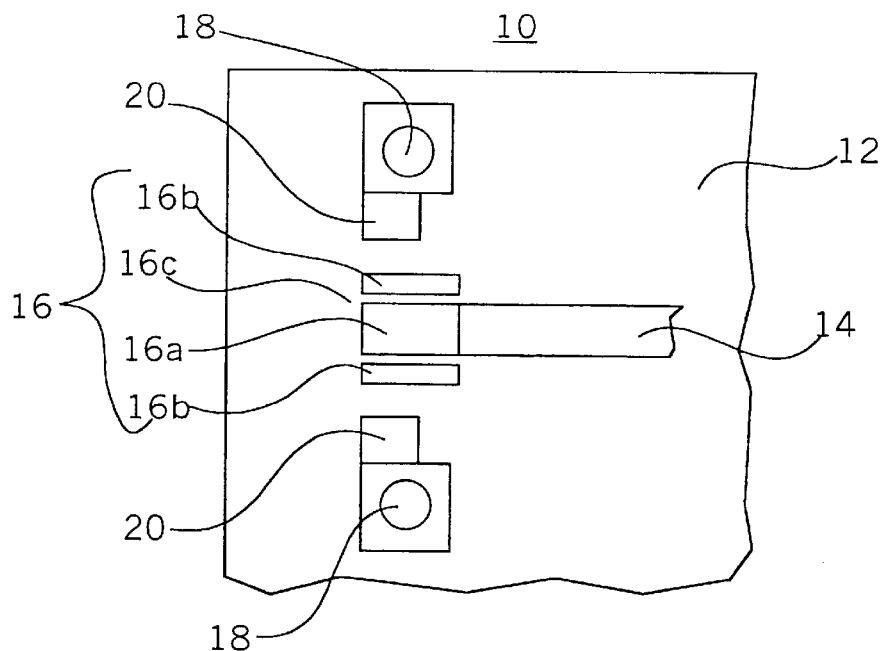
FIG. 1 is a plan view of part of an MMIC according to a first embodiment of the present invention.

FIG. 1 is a plan view of part of an MMIC according to a first embodiment of the present invention.

In FIG. 1, reference numeral 10 denotes an MMIC as an RF circuit chip. Reference numeral 12 denotes a GaAs substrate as a substrate of the MMIC 10. The GaAs substrate 12 is as thick as about 100 $\mu$m and a grounding metal film (not shown) is formed on its back surface. Reference numeral 14 denotes a main line as a first wiring layer formed on the GaAs substrate 12. The mainline 14 is formed by metal evaporation or has a structure that a top plated Au layer is formed on an evaporated metal layer.

Where the GaAs substrate 12 is as thick as about 100 $\mu$m and the characteristic impedance should be equal to 50$\Omega$, the width of the main line 14 is set at about 70 $\mu$m and a microstrip line is formed by the main line 14 and the grounding metal film formed on the back surface of the GaAs substrate 12.

Reference symbol 16a denotes a pad main portion of the RF pad 16 that is disposed at the end of the main line 14. The pad main portion 16a has the same width as the main line 14. Reference symbol 16b denotes pad auxiliary portions as first and second conductor films that are disposed independently along the pad main portion 16a on both sides thereof with slits 16c formed in between and that are parts of the RF pad 16. Although in this MMIC 10 the pad auxiliary portions 16b are disposed on both sides of the pad main portion 16a, they may be disposed adjacent to the pad main portion 16a on one side thereof. The two kinds of structures have the same function because the pad auxiliary portions 16b are electrically connected to the pad main portion 16a after wire bonding.

Where the main line 14 is formed by metal evaporation, the pad main portion 16a and the pad auxiliary portions 16b are formed through plating after formation of the main line 14. Where the main line 14 has a structure that a top plated Au layer is formed on an evaporated metal layer, the pad main portion 16a is just an end portion of the main line 14 and the pad auxiliary portions 16b are formed simultaneously with the main line 14 in the same manufacturing step.

Reference numeral 18 denotes via holes that are connected to a back surface grounding metal film (not shown). Reference numeral 20 denotes grounding wiring layers as grounding conductor films that are connected to the respective via holes 18. The grounding wiring layers 20 are disposed on both sides of the pad main portion 16a with the respective pad auxiliary portions 16b interposed in between.

Although in this MMIC 10 the grounding wiring layers 20 are disposed on both sides of the pad main portion 16a, only a single grounding wiring layer 20 may be disposed on one side of the pad main portion 16a depending on the probe for measuring the RF characteristics.

FIG. 1 shows only part of the MMIC 10, that is, an end portion of the main line 14, the RF pad 16, and the grounding wiring layer 18. Although not shown in FIG. 1, in the MMIC 10 the main line 14 is connected to circuit elements such as transistors (active devices) and passive devices.

Figure 2:
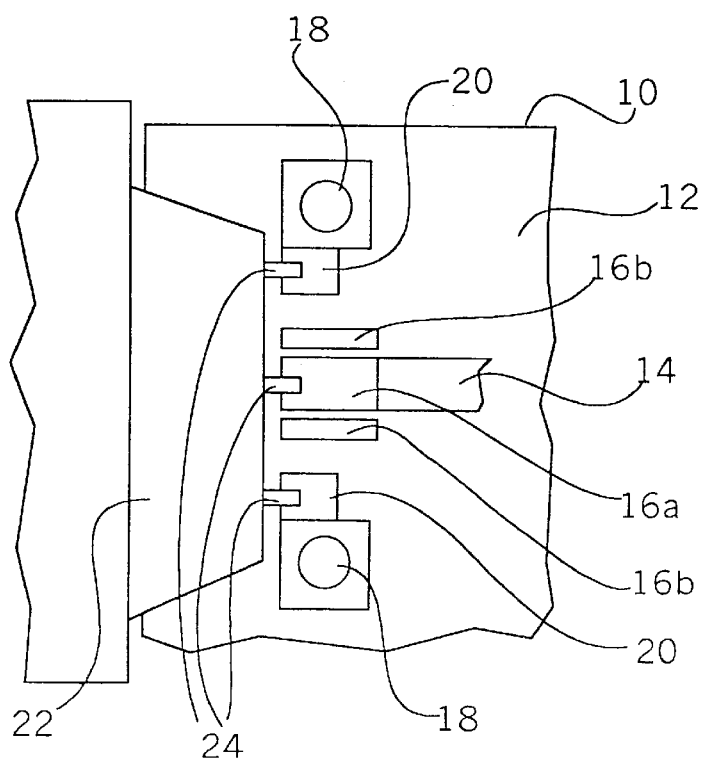
FIG. 2 is a schematic diagram showing a method for measuring the chip characteristics of the MMIC 10 according to the first embodiment.

FIG. 2 is a schematic diagram showing a method for measuring the chip characteristics of the MMIC 10 according to this embodiment.

In FIG. 2, reference numeral 22 denotes a probe head and numeral 24 denotes probes as contact terminals that are attached to the probe head 22.

Usually, the chip characteristics such as the RF characteristics are measured when the MMIC 10 has been formed on a wafer. A set of three probes 24 that are attached to the probe head 22 is used. Reflection characteristics S11 and S22, a passing characteristic S21, etc. are measure in a state that the central probe 24 is in contact with the pad main portion 16a that is connected to the main line 14 and the two side probes 24 are in contact with the respective grounding wiring layers 18.

Since the pad main portion 16a has the same width as the main line 14, that is, does not project from the sidelines of the main line 14, there is no increase in impedance due to the pad parallel parasitic capacitance. The RF characteristics of the MMIC 10 are measured according to the same circuit specification as at the designing stage.

Therefore, even in a particularly high frequency range, for example, in the millimetric wave band where the frequency exceeds 60 GHz, discrimination between good products and defective products can be made correctly based on the chip characteristics of the MMIC chip 10, which makes it possible to provide MMIC chips having only small variations in the chip electrical characteristics such as the RF characteristics.

Figure 3:
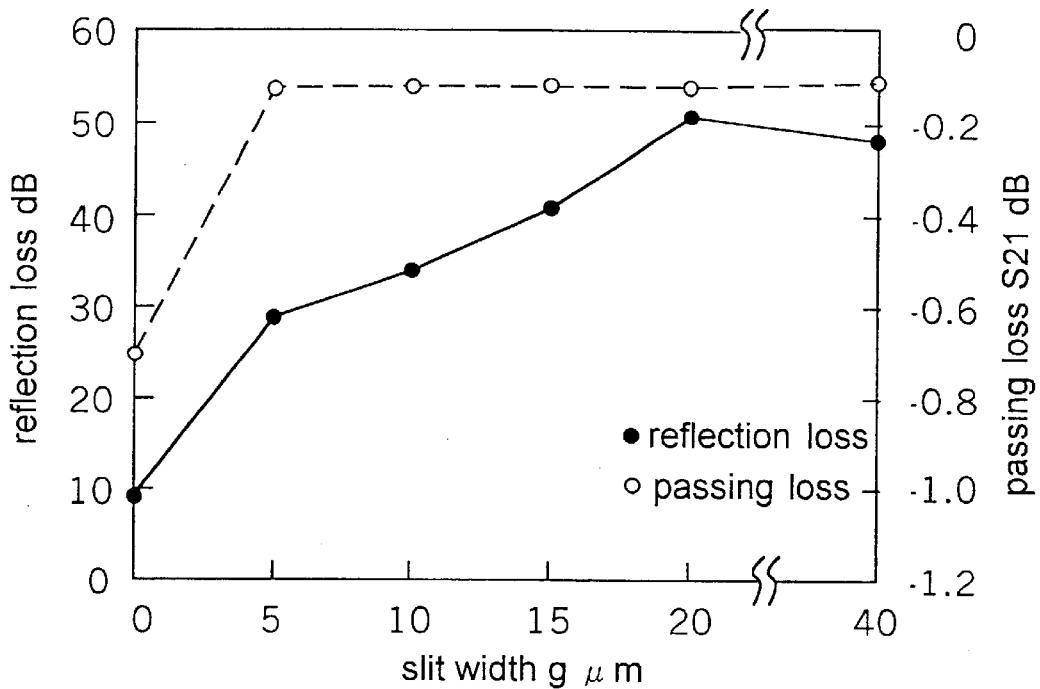
FIG. 3 is a graph showing dependence of the RF characteristics of the pad according to the embodiment on the slit width.

FIG. 3 is a graph showing dependence of the RF characteristics of the pad according to this embodiment on the slit width.

In FIG. 3, the vertical axis represents the reflection loss and the passing loss and the horizontal axis represents the slit interval. The polygonal line with solid circles is a reflection loss curve and the polygonal line with hollow circles is a passing loss S21 curve. Calculations were made at 80 GHz.

Figure 4:
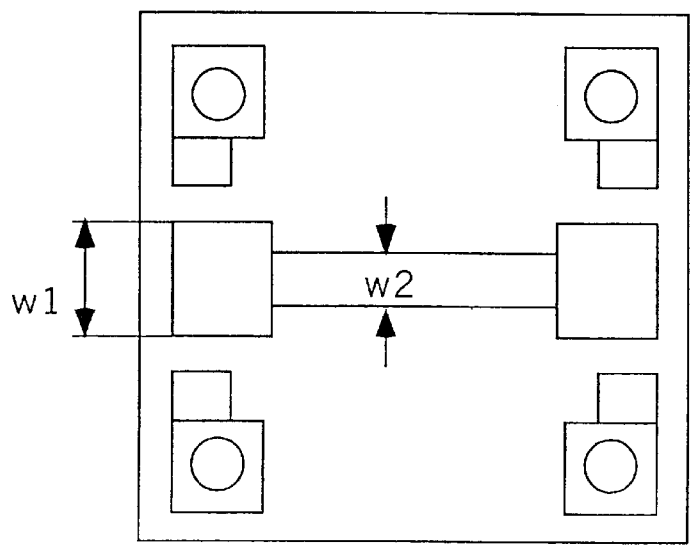
FIG. 4 is a plan view of pads having a conventional structure that were used for the analysis of FIG. 3.
Figure 5:
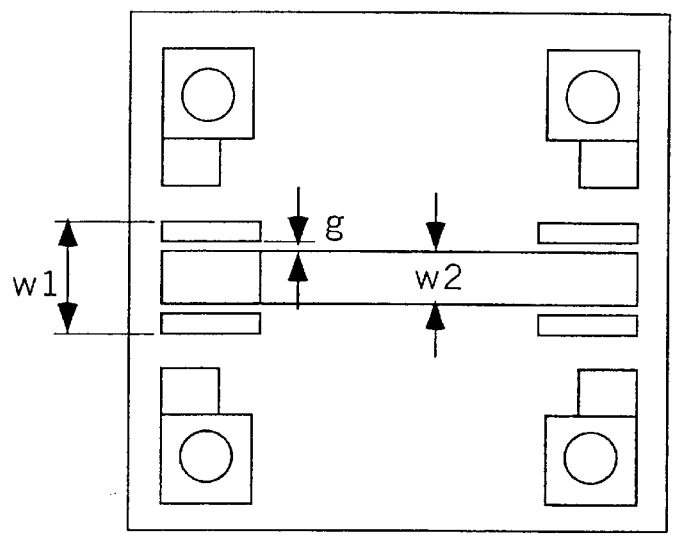
FIG. 5 is a plan view of pads according to the first embodiment of the invention that were used for the analysis of FIG. 3.
Figure 6:
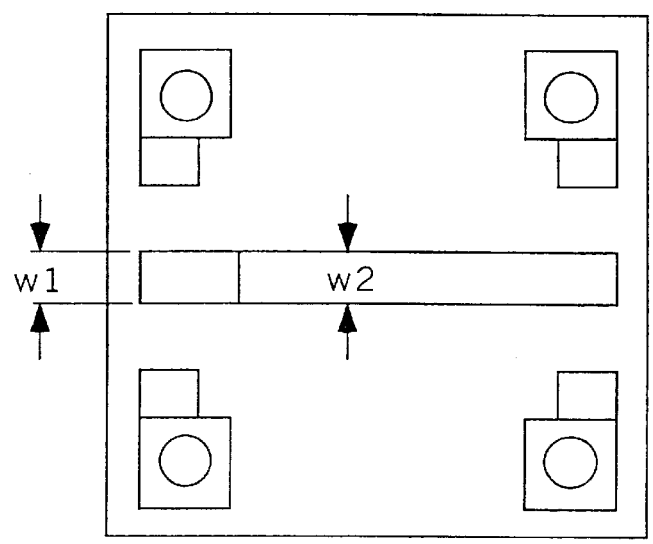
FIG. 6 is a plan view of pads having an ideal structure that were used for the analysis of FIG. 3.

FIG. 4 is a plan view of pads having a conventional structure that were used for the analysis of FIG. 3. FIG. 5 is a plan view of pads according to the first embodiment of the invention that were used for the analysis of FIG. 3. FIG. 6 is a plan view of pads having an ideal structure that were used for the analysis of FIG. 3.

FIG. 4 simulates the conventional pad structure. In FIG. 4, the pad width W1 is 150 $\mu$m and the width W2 of the main line 14 is 70 $\mu$m.

FIG. 5 simulates the pad shape according to this embodiment. In FIG. 5, the pad width W1 is 150 $\mu$m and the slit interval g between the pad main portion 16a and the pad auxiliary portions 16b is varied so as to have values 5 $\mu$m, 10 $\mu$m, 15 $\mu$m, and 20 $\mu$m.

FIG. 6 simulates the pad shape at the designing stage in which the width W1 of the pad main portion 16a is equal to the width W2 of the main line 14.

In other words, the conventional pad shape of FIG. 4 corresponds to a case where in FIG. 5 the pad width W1 is set at 150 $\mu$m and the slit interval g is set at 0 $\mu$m. The pad shape of FIG. 6 in which the width of the pad main portion 16a is equal to that of the main line 14 corresponds to a case where in FIG. 5 the pad width W1 is set at 150 $\mu$m, the width W2 of the main line 14 is set at 70 $\mu$m, and the slit interval g is set at 40 $\mu$m.

Therefore, in FIG. 3, the values of the reflection loss and the passing loss with g=0 $\mu$m are values of the conventional pad shape and the values of the reflection loss and the passing loss with g=40 $\mu$m are values of the pad shape at the designing stage in which the width of the pad main portion 16a is equal to that of the main line 14.

It is seen from FIG. 3 that when g is greater than or equal to 5 $\mu$m, the passing loss has a value that is approximately equal to the value of the ideal characteristics that are obtained with the pad shape of FIG. 6 in which the width of the pad main portion 16a is equal to that of the main line 14.

It is also seen that the passing loss is improved by about 19 dB when g=5 $\mu$m and approaches the value of the pad shape in which the width of the pad main portion 16a is equal to that of the main line 14 as g increases.

In summary, the RF characteristics are improved as the slit interval g increases. The upper limit value of g is determined by the wire bonding strength etc.

As described above, in the RF circuit chip according to this embodiment, by properly setting the slit interval g between the pad main portion 16a and the pad auxiliary portions 16b, not only do the pad main portion 16a and the pad auxiliary portions 16b secure a sufficient wire bonding area but also the electrical characteristics of the MMIC chip 10 can be measured and evaluated without increase in bonding pad capacitance by bringing probes into contact with the pad main portion 16a and the grounding wiring layers 20.

Therefore, discrimination between good products and defective products can be made correctly based on the chip characteristics of the RF circuit chip, which makes it possible to provide RF circuit chips having only small variations in the chip electrical characteristics such as the RF characteristics.

Figure 7:
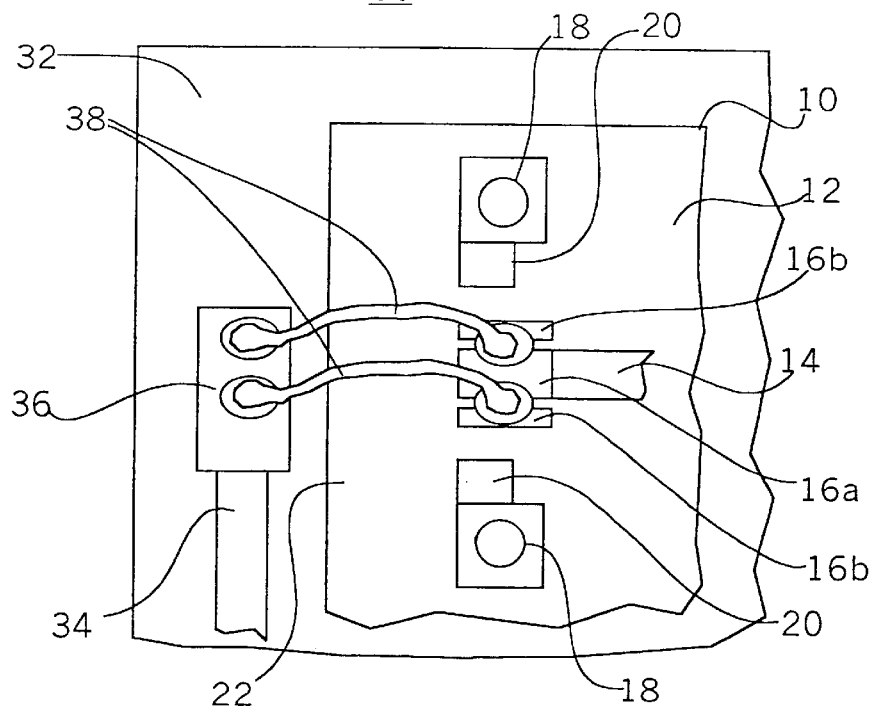
FIG. 7 is a plan view of part of a module according to the first embodiment of the invention.

FIG. 7 is a plan view of part of a module according to the first embodiment of the invention.

In FIG. 7, reference numeral 30 denotes a module and numeral 32 denotes an alumina substrate as a dielectric substrate of the module 30. A glass epoxy substrate maybe used instead of the alumina substrate 32.

Reference numeral 34 denotes a main line as a second wiring line that is provided on the surface of the alumina substrate 32. The main line 34 has a structure that a top plated Au layer is formed on an evaporated metal layer. Reference numeral 36 denotes a pad portion of the main line 34. Reference numeral 38 denotes bonding wires as first and second connection conductors that connect the RF pad 16 of the MMIC chip 10 to the pad portion 36 of the main line 34 on the alumina substrate 32.

To decrease the inductance, the two bonding wires 38 are arranged parallel with each other. Each wire 38 is bonded in such a manner as to bridge the pad main portion 16a and one of the two pad auxiliary portions 16b on the RF pad 16 of the MMIC chip 10 and as to extend parallel with the main line 14.

Since the width of the pad auxiliary portions 16b of the RF pad 16 and the slit interval g between the pad main portion 16a and the pad auxiliary portions 16b are so determined as to secure sufficient bonding strength of the bonding wires 38, the mechanical reliability and the electrical reliability of the bonding are secured.

As described above, as for the module and the package as the RF circuit device according to this embodiment, the electrical characteristics can be evaluated properly at the designing stage, the chip production stage, and the mounting stage and a module or package is assembled by mounting an MMIC chip having only small variations in electrical characteristics. As such, this embodiment makes it possible to construct an RF circuit device that can be produced at a high yield and is inexpensive and highly reliable.

Second Embodiment

Figure 8:
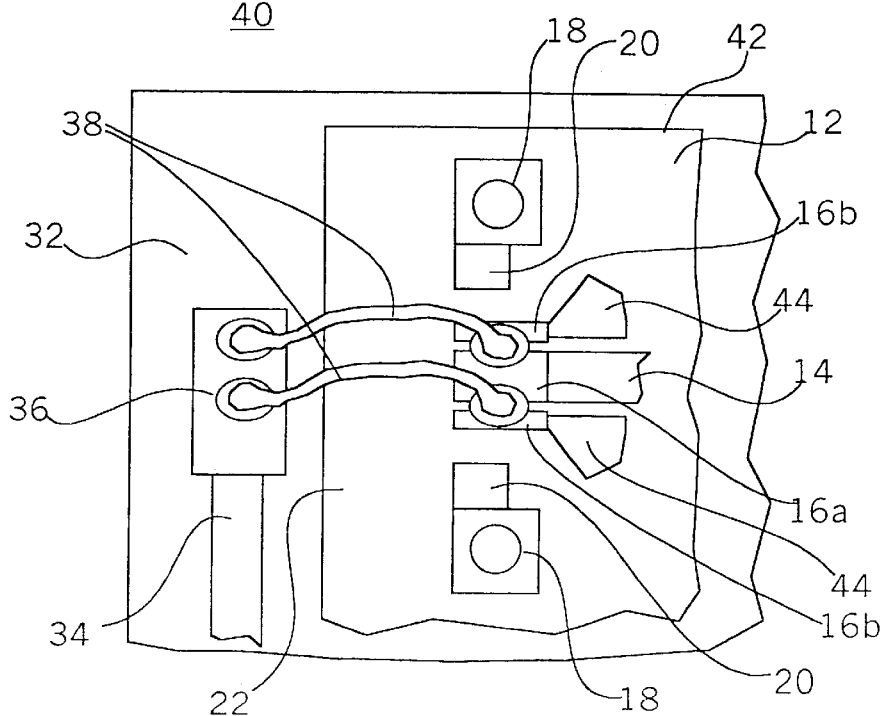
FIG. 8 is a plan view of part of a module according to a second embodiment of the invention.

FIG. 8 is a plan view of part of a module according to a second embodiment of the invention. The reference symbols in FIG. 8 that are the same as in FIG. 2 denote the same or corresponding members. The same reference symbols denote the same or corresponding members also in the drawings that will be used the following embodiments.

In FIG. 8, reference numeral 40 denotes a module as an RF circuit device and numeral 42 denotes an MMIC chip that is die-bonded to the module 40. Reference numeral 44 denotes additional capacitor films provided on the substrate of the MMIC chip 42. The additional capacitor films 44 have the same layered structure as the pad auxiliary portions 16b and are connected to the respective pad auxiliary portions 16b.

In the MMIC chip 42 used in the module 40, as in the case of the MMIC chip 10 according to the first embodiment, since the pad main portion 16a has the same width as the main line 14, that is, does not project from the sidelines of the main line 14, there is no increase in impedance due to the pad parallel parasitic capacitance. The RF characteristics of the MMIC chip 42 are measured according to the same circuit specification as at the designing stage. Therefore, even in a particularly high frequency range, for example, in the millimetric wave band where the frequency exceeds 60 GHz, discrimination between good products and defective products can be made correctly based on the chip characteristics of the MMIC chip 42.

Further, in the module 40 using the MMIC chip 42, it is possible to cause the parallel capacitance of the pad auxiliary portions 16b to substantially cancel out the parasitic inductance of the bonding wires 38 by properly designing the additional capacitor films 44 that are connected to the respective pad auxiliary portions 16b.

In the module 40, when the bonding wires 38 are bonded so as to bridge the pad main portion 16a and the respective pad auxiliary portions 16b, the pad main portion 16a and the pad auxiliary portions 16b are unified electrically by the bonding wires 38 and the pad auxiliary portions 16b come to influence the electrical characteristics of the MMIC chip 42.

Determining the shape and the dimensions of the additional capacitor films 44 that are connected to the respective pad auxiliary portions 16b according to Equation (1) makes it possible to cause the capacitance of the pad auxiliary portions 16b to effectively cancel out the parasitic inductance component of the bonding wires 38, to thereby substantially eliminate the influence on the chip characteristics.

$$Z0 = 50\Omega = ((L+Lw)/(C+Cstb))^{1/2} \qquad 1$$

Where L is the series inductance of the main line 14 that is connected to the pad main portion 16a, C is the parallel capacitance of the main line 14 that is connected to the pad main portion 16a, Lw is the series inductance of the bonding wires 38, and Cstb is the parallel capacitance of the pad auxiliary portions 16b and the additional capacitor films 44 collected.

In the MMIC chip 42 of the module 40, the pad auxiliary portions 16b and the additional capacitor films 44 serve as an open stub and thereby cancel out the parasitic inductance component of the bonding wires 38, whereby the chip electrical characteristics such as the RF characteristics measured in producing the MMIC chip 42 coincide with the electrical characteristics obtained when the MMIC chip 42 is mounted in the module 40. Therefore, the electrical characteristics obtained when the MMIC chip 42 is mounted in the module 40 directly reflects the electrical characteristics measured in producing the MMIC chip 42, making it possible to provide an RF circuit device that can be produced at a high yield and is inexpensive and highly reliable.

Third Embodiment

Figure 9:
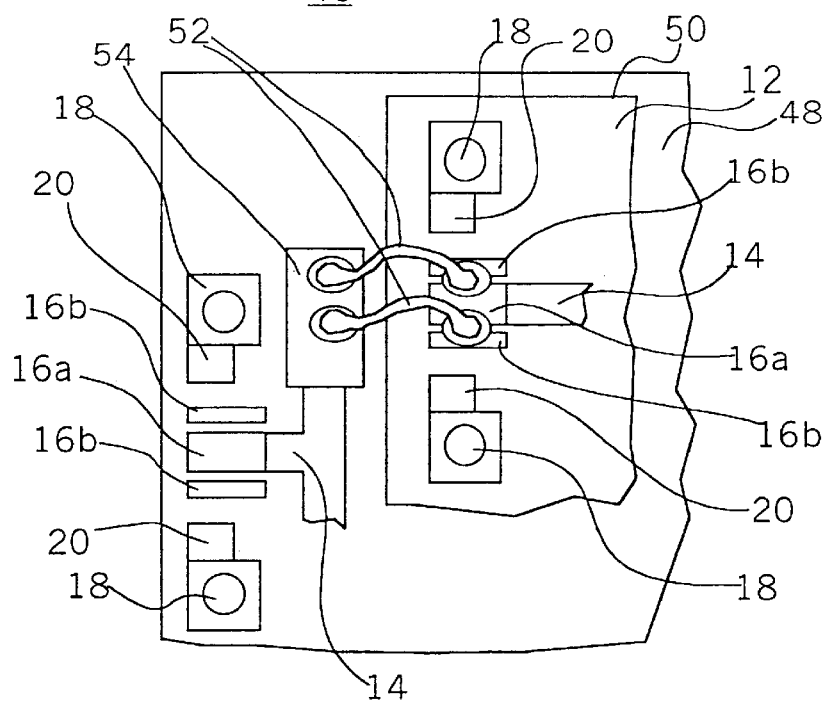
FIG. 9 is a plan view of part of an MIC (Microwave Integrated Circuit) according to a third embodiment of the invention.

FIG. 9 is a plan view of part of an MIC (Microwave Integrated Circuit) according to a third embodiment of the invention.

In FIG. 9, reference numeral 46 denotes an MIC chip and numeral 48 denotes an alumina substrate of the MIC chip 46. Another type of dielectric substrate may be used instead of the alumina substrate 48.

In this MIC chip 46, to reduce the cost, an inexpensive dielectric substrate such as the alumina substrate 48 is used in regions where an expensive GaAs substrate is not necessary and a GaAs substrate is used in regions where it is necessary such as a region where transistors, for example, are formed.

Reference numeral 50 denotes an MIC chip containing transistors, passive devices, etc. that are formed on a GaAs substrate that is die-bonded to the MIC chip 46.

Reference numeral 52 denotes wires that connect the RF pad 16 of the MIC chip 50 to the pad 54 of the main line 14 of the MIC chip 46.

In this embodiment, the electrical characteristics of each of the MIC chip 50 including the RF pad 16 and the MIC chip 46 to which the MIC chip 50 has been die-bonded and includes the RF pad 16 are measured when the chip has been produced.

As in the case of the first embodiment, since the pad main portion 16a of each RF pad 16 has the same width as the main line 14, that is, does not project from the sidelines of the main line 14, there is no increase in impedance due to the pad parallel parasitic capacitance. The RF characteristics of each of the MIC chips 46 and 50 are measured according to the same circuit specification as at the designing stage.

Therefore, even in a particularly high frequency range, discrimination between good products and defective products can be made correctly based on the chip characteristics of the MIC chips 46 and 50. This makes it possible to provide an MIC chip that has only small variations in the chip electrical characteristics such as the RF characteristics and is inexpensive because of use of a reduced amount of a GaAs substrate which is expensive.

Figure 10:
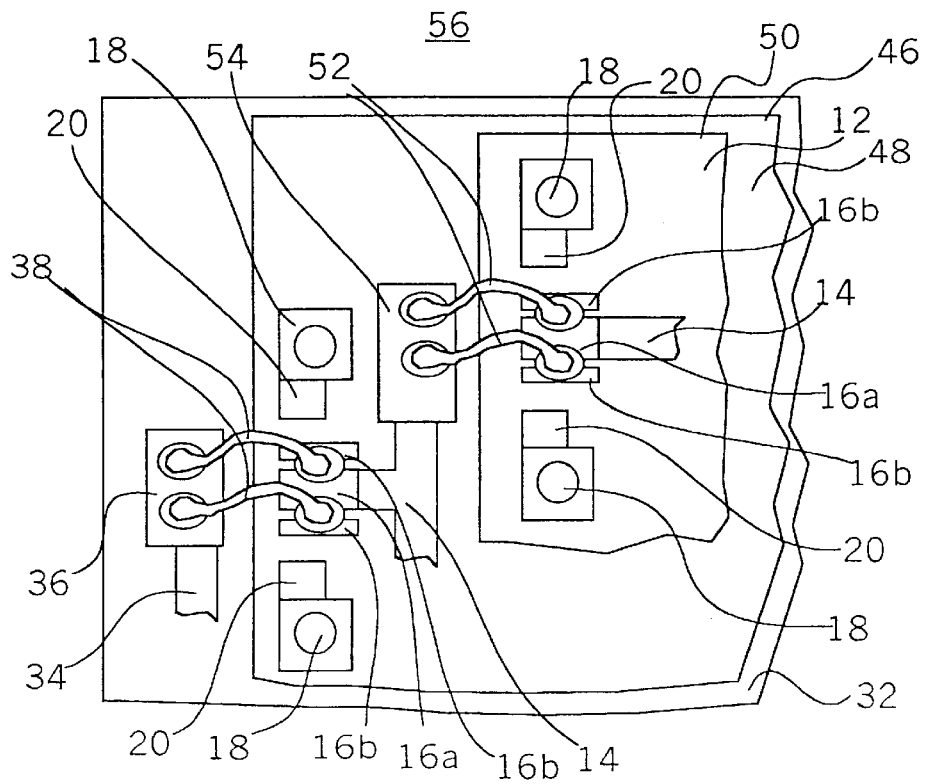
FIG. 10 is a plan view of a module according to the third embodiment of the invention.

FIG. 10 is a plan view of a module according to the third embodiment of the invention.

In FIG. 10, reference numeral 56 denotes a module as an RF circuit device.

The module 56 has the same basic configuration as the module 30 according to the first embodiment except that the MIC chip 46 as an RF circuit chip is die-bonded to the alumina substrate 32.

Therefore, the module 56 as the RF circuit device according to the third embodiment is also assembled by mounting the MIC chip 46 having only small variations in electrical characteristics and hence can be produced at a high yield. With an additional advantage that the cost of the MIC chip 46 is low, an RF circuit device that is inexpensive and highly reliable can be constructed.

Fourth Embodiment

Figure 11:
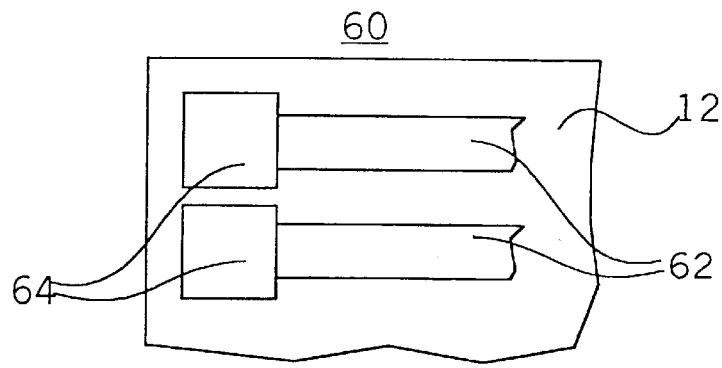
FIG. 11 is a plan view of part of an MMIC chip according to a fourth embodiment of the invention.

FIG. 11 is a plan view of part of an MMIC chip according to a fourth embodiment of the invention.

In FIG. 11, reference numeral 60 denotes an MMIC chip. Reference numeral 62 denotes DC bias lines as first wiring layers that are provided on the surface of the MMIC chip 60. Reference numeral 64 denotes DC pads provided adjacent to each other at the ends of the respective DC bias lines 62 with an interval formed in between.

FIG. 11 shows only part of the MMIC 60, that is, end portions of the DC bias lines 62 and the DC pads 64. Although not shown in FIG. 11, in the MMIC 60 the DC bias lines 62 are connected to circuit elements such as transistors (active devices) and passive devices.

Figure 12:
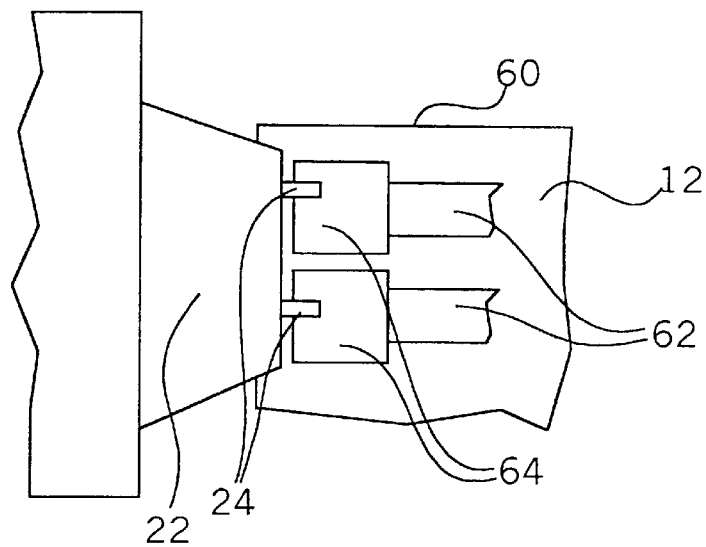
FIG. 12 is a schematic diagram showing how the chip characteristics of the MMIC chip according to the fourth embodiment of the invention are measured.

FIG. 12 is a schematic diagram showing how the chip characteristics of the MMIC chip 60 according to the fourth embodiment of the invention are measured. Specifically, FIG. 12 shows a method for applying DC bias voltages in evaluating the MMIC 60.

As shown in FIG. 12, the chip characteristics of the MMIC chip 60 are measured in such a manner that probes 24 that are attached to a probe head 22 are brought into contact with the respective DC pads 64 that are provided at the ends of the respective DC bias lines 62 and DC bias voltages are applied to the respective DC pads 64. Where the MMIC chip 60 is an amplification circuit, for example, the measurement of the chip characteristics would sometimes be difficult due to oscillation if the DC bias lines 62 did not have separate ends, because the MMIC 60, which is not grounded at this stage, is unstable. In contrast, according to this embodiment, by applying bias voltages to the separate DC pads 64, oscillation can be prevented to enable proper judgment of good products and defective products.

Figure 13:
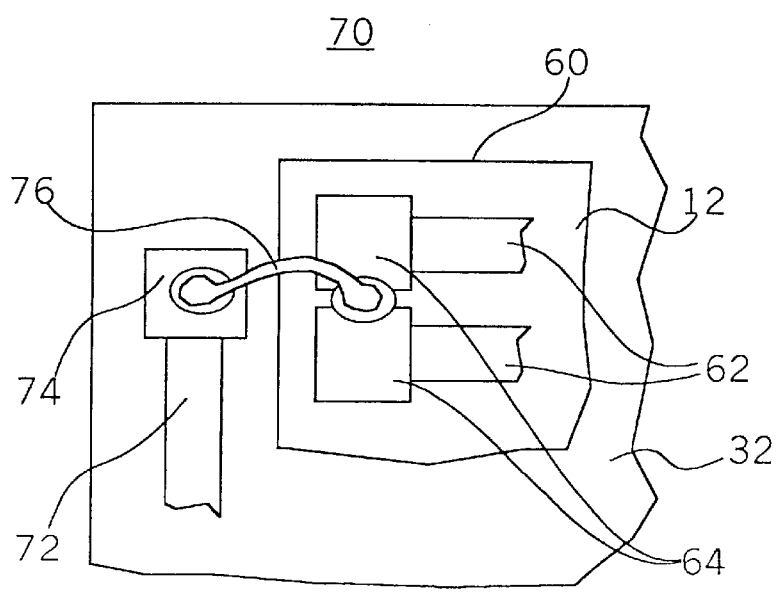
FIG. 13 is a plan view of part of a module according to the fourth embodiment of the invention.
Figure 14:
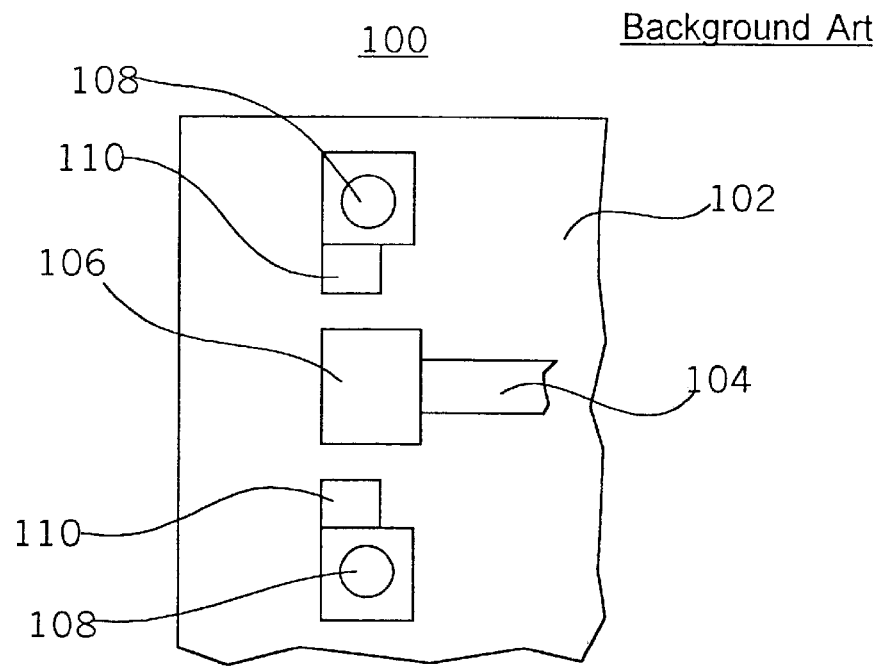
FIG. 14 is a plan view of part of a conventional MMIC chip.
Figure 15:
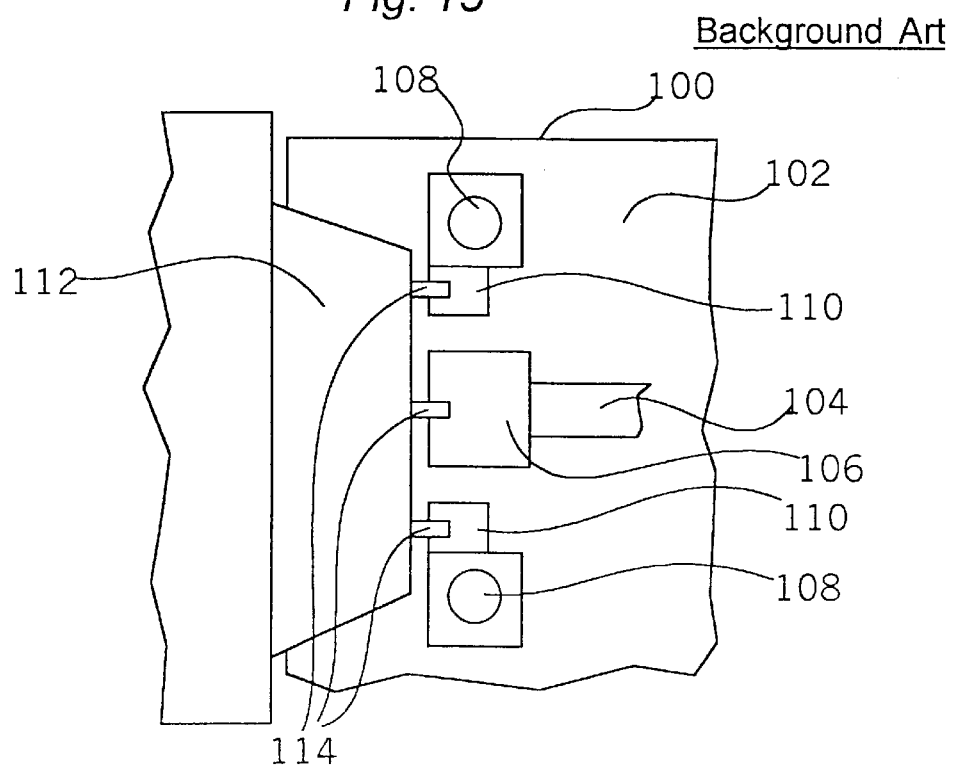
FIG. 15 is a schematic diagram showing how the RF characteristics of the conventional MMIC chip are measured.
Figure 16:
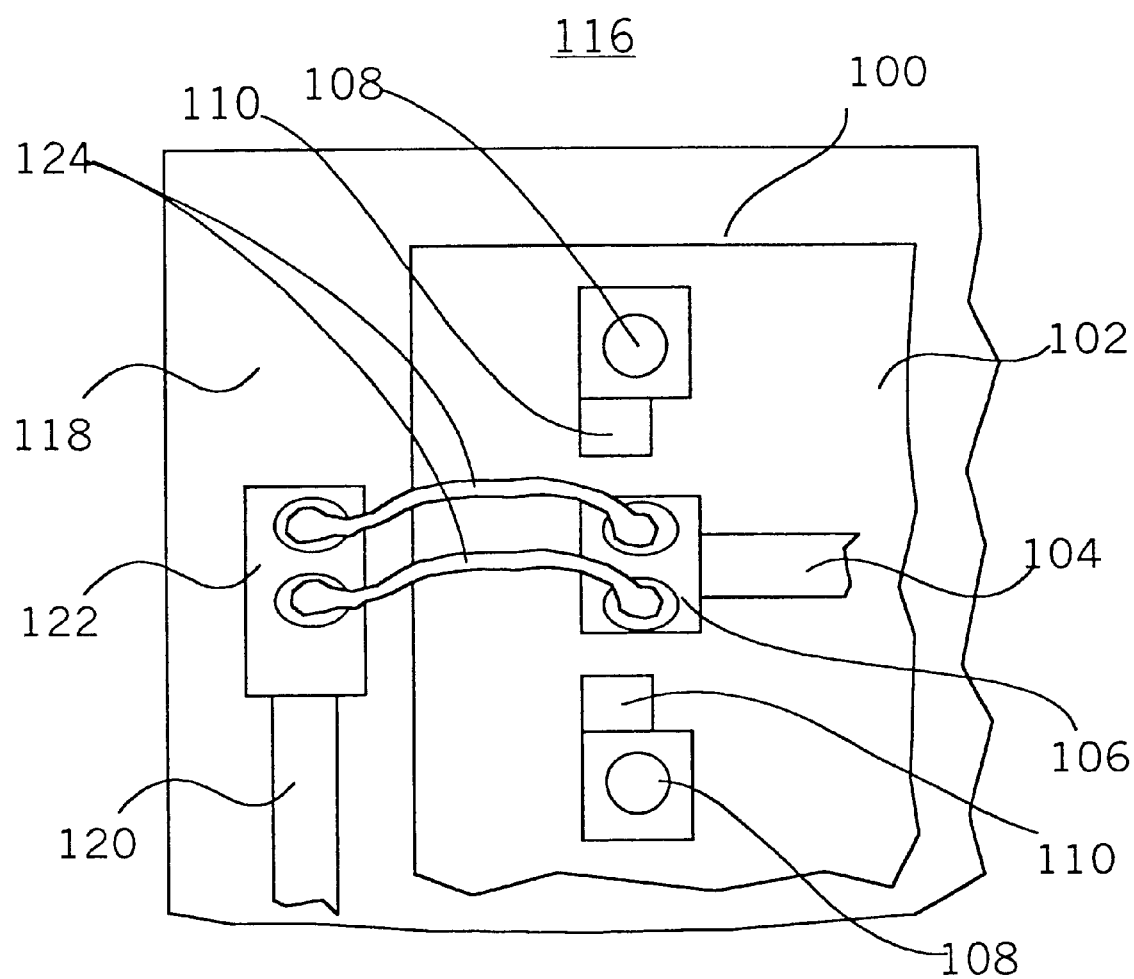
FIG. 16 is a plan view of part of a module in which the conventional MMIC chip is mounted.

FIG. 13 is a plan view of part of a module according to the fourth embodiment of the invention.

In FIG. 13, reference numeral 70 denotes a module as an RF circuit device and numeral 72 denotes a DC bias line as a second wiring layer. The DC bias line 72 is provided on the surface of an alumina substrate 32 and has a structure that a top plated Au layer is formed on an evaporated metal layer. Reference numeral 74 denotes a DC pad of the DC bias line 72. The DC pad 74 has the same structure as the DC bias line 72. Reference numeral 76 denotes a bonding wire as a third connection conductor.

In the module 70, one end of the bonding wire 76 is bonded to the DC pads 64 so as to bridge the DC pads 64 that are provided with an interval formed in between at the ends of the respective DC bias lines 62 that are arranged parallel with each other on the surface of the MMIC chip 60. The other end of the bonding wire 76 is bonded to the DC pad 74 of the DC bias line 72 that is provided on the alumina substrate 32.

In the module 70 as the RF circuit device according to the fourth embodiment, the electrical characteristics can be evaluated properly in producing the MMIC chip 60. And the module 70 can be assembled by mounting the MMIC chip 60 having only small variations in electrical characteristics. As a result, an RF circuit device that can be produced at a high yield and is inexpensive and highly reliable can be constructed.

Although each of the above embodiments is directed to the module, the same advantages can be obtained even in the case of a package.

The features and the advantages of the present invention may be summarized as follows. Namely, the RF circuit chip, the RF circuit device, and their manufacturing methods according to the invention have the following features and the advantages.

An RF circuit chip according to one aspect of the invention comprises a first wiring layer provided on a substrate and having an end portion; first and second conductor films provided in an island-like manner adjacent to the end portion of the first wiring layer on one or both sides thereof; and a grounding conductor film provided on at least one side of the end portion with at least one of the first and second conductor films interposed in between. This configuration makes it possible to evaluate the chip electrical characteristics according to the same specification as at the designing stage without increase in bonding wire capacitance while securing a sufficient wire bonding area. Also, differences from the electrical characteristics after wire bonding can be reduced. As a result, an RF circuit chip having only small variations in electrical characteristics can be provided.

Another RF circuit chip according to another aspect of the invention comprises first wiring layers provided on a substrate so as to extend parallel with each other with a prescribed interval formed in between and having respective end portions that are adjacent to each other with an interval formed in between. With this configuration, DC bias voltages can be applied individually to the end portions of the respective first wiring layers and hence the chip electrical characteristics can be measured with only small influence of an RF signal. As a result, an RF circuit chip having only small variations in electrical characteristics can be provided.

In another aspect of the invention, the substrate may be a GaAs substrate. In this case, an RF circuit chip having only small variations in electrical characteristics can be provided with a simple configuration.

In another aspect of the invention, the substrate may also be a dielectric substrate. By employing a dielectric substrate in regions where a semiconductor substrate is not necessary, an RF circuit chip having only small variations in electrical characteristics can be provided with an inexpensive configuration.

An RF circuit device according to another aspect of the invention comprises a dielectric substrate; an RF circuit chip provided on the dielectric substrate, the RF circuit chip comprising a first wiring layer provided on a substrate and having an end portion; first and second conductor films provided in an island-like manner adjacent to the end portion of the first wiring layer on one or both sides thereof; and a grounding conductor film provided on at least one side of the end portion with at least one of the first and second conductor films interposed in between; a second wiring layer provided on the dielectric substrate; a first connection conductor having a first end and a second end, the first end being connected to the end portion of the first wiring layer of the RF circuit chip and the first conductor film so as to bridge those, the second end being connected to the second wiring layer; and a second connection conductor having a first end and a second end, the first end being connected to the end portion of the first wiring layer of the RF circuit chip and the second conductor film so as to bridge those, the second end being connected to the second wiring layer. This configuration makes it possible to secure a sufficient bonding area, maintain the mechanical strength and the electrical characteristics of the bonding, and decrease variations in the electrical characteristics such as the RF characteristics. As a result, an RF circuit device that can be produced at a high yield and is inexpensive and highly reliable can be provided.

In another aspect of the invention, the first and second conductor films may form an open stub having capacitance that substantially cancels out the parasitic inductance of the first and second connection conductors. In this case, the chip electrical characteristics such as the RF characteristics can be kept the same at the designing stage, the chip evaluation stage, and the chip mounting stage. Since the electrical characteristics at the chip mounting stage directly reflect those at the chip evaluation stage, an RF circuit device that can be produced at a high yield and is inexpensive and highly reliable can be provided.

Another RF circuit device according to another aspect of the invention comprises a dielectric substrate; an RF circuit chip provided on the dielectric substrate and comprising first wiring layers provided on a substrate so as to extend parallel with each other with a prescribed interval formed in between and having respective end portions that are adjacent to each other with an interval formed in between; a second wiring layer provided on the dielectric substrate and to be supplied with a DC bias voltage; and a third connection conductor having a first end and a second end, the first end being connected to the end portions of the first wiring layers of the RF circuit chip so as to bridge those, the second end being connected to the second wiring layer. This configuration makes it possible to secure a sufficient bonding area, maintain the mechanical strength and the electrical characteristics of the bonding, and decrease variations in the electrical characteristics such as the RF characteristics. As a result, an RF circuit device that can be produced at a high yield and is inexpensive and highly reliable can be provided.

A manufacturing method of an RF circuit chip according to another aspect of the invention comprises the steps of forming, on a substrate, an RF circuit comprising a first wiring layer having an end portion, first and second conductor films provided in an island-like manner adjacent to the end portion of the first wiring layer on one or both sides thereof, and a grounding conductor film provided on at least one side of the end portion of the first wiring layer with at least one of the first and second conductor films interposed in between; and measuring electrical characteristics of the RF circuit by bringing contact terminals into contact with the end portion of the first wiring layer of the RF circuit and the grounding conductor film. This manufacturing method makes it possible to evaluate the chip electrical characteristics such as the RF characteristics according to the same specification as at the designing stage and therefore to properly judge for good products and defective products when chips have been produced. As a result, RF circuit chips that are uniform in electrical characteristics can be manufactured.

Another manufacturing method of an RF circuit chip according to another aspect of the invention comprises the steps of forming, on a substrate, an RF circuit comprising first wiring layers extending parallel with each other with a prescribed interval formed in between and having respective end portions that are adjacent to each other with an interval formed in between; and measuring electrical characteristics of the RF circuit by bringing contact terminals into contact with the end portions of the respective first wiring layers of the RF circuit and applying DC bias voltages to the respective end portions. This manufacturing method makes it possible to properly evaluate the chip electrical characteristics by applying DC bias voltages with only small influence of an RF signal and therefore to properly judge for good products and defective products when chips have been produced. As a result, RF circuit chips that are uniform in electrical characteristics can be manufactured.

Another manufacturing method of an RF circuit device according to another aspect of the invention comprises the steps of manufacturing an RF circuit chip by forming, on a substrate, an RF circuit comprising a first wiring layer having an end portion, first and second conductor films provided in an island-like manner adjacent to the end portion of the first wiring layer on one or both sides thereof, and a grounding conductor film provided on at least one side of the end portion of the first wiring layer with at least one of the first and second conductor films interposed in between; and measuring electrical characteristics of the RF circuit by bringing contact terminals into contact with the end portion of the first wiring layer of the RF circuit and the grounding conductor film; and bonding the RF circuit chip to a dielectric substrate on which a second wiring layer is formed, connecting one end of a first connection conductor to the end portion of the first wiring layer of the RF circuit chip and the first conductor film so as to bridge those and the other end of the first connection conductor to the second wiring layer, and connecting one end of a second connection conductor to the end portion of the first wiring layer of the RF circuit chip and the second conductor film so as to bridge those and the other end of the second connection conductor to the second wiring layer. This manufacturing method makes it possible to manufacture, by a simple process, an RF circuit device that has sufficient mechanical strength and good electrical characteristics of the bonding and has only mall variations in the electrical characteristics such as the RF characteristics. As a result, an RF circuit device that can be produced at a high yield and is inexpensive and highly reliable can be provided.

Another manufacturing method of an RF circuit device according to another aspect of the invention comprises the steps of manufacturing an RF circuit chip by forming, on a substrate, an RF circuit comprising first wiring layers extending parallel with each other with a prescribed interval formed in between and having respective end portions that are adjacent to each other with an interval formed in between; and measuring electrical characteristics of the RF circuit by bringing contact terminals into contact with the end portions of the respective first wiring layers of the RF circuit and applying DC bias voltages to the respective end portions; and bonding the RF circuit chip to a dielectric substrate on which a second wiring layer is formed, and connecting one end of a third connection conductor to the end portions of the first wiring layers of the RF circuit chip so as to bridge those and the other end of the third connection conductor to the second wiring layer. This manufacturing method makes it possible to manufacture, by a simple process, an RF circuit device that has sufficient mechanical strength and good electrical characteristics of the bonding and has only mall variations in the electrical characteristics. As a result, an RF circuit device that can be produced at a high yield and is inexpensive and highly reliable can be provided.

Obviously many modifications and variations of the present invention are possible in the light of the above teachings. It is therefore to be understood that within the scope of the appended claims the invention may by practiced otherwise than as specifically described."

The entire disclosure of a Japanese Patent Application No. 2001-137421, filed on May 8, 2001 including specification, claims, drawings and summary, on which the Convention priority of the present application is based, are incorporated herein by reference in its entirety."

What is claimed is:

1. An FR circuit chip comprising:
   a first wiring layer extending in a lengthwise direction on a substrate, the first wiring layer having a width and an end having the width;
   first and second conducting film islands adjacent to and spaced from the end of the first wiring layer by respective gaps and on at least one side of the end of the first wiring layer;
   a grounding conducting film on at least one side of the end of the first wiring layer with at least one of the first and second conducting film islands interposed between the end of the first wiring layer and the grounding conducting film; and
   a wire having an end bonded to both of the end of the first wiring layer and one of the first and second conducting film island, across one of the gaps.

2. The RF circuit chip according to claim 1, wherein the substrate is a GaAs substrate.

3. The RF circuit chip according to claim 1, wherein the substrate is a dielectric substrate.

4. An RF circuit chip comprising:
   a dielectric substrate;
   an RF circuit chip on the dielectric substrate, the RF circuit chip comprising:
      a first wiring layer extending in a lengthwise direction on a substrate, the first wiring layer having a width and an end having the width;
      first and second conducting film islands adjacent to and spaced from the end of the first wiring layer by respective gaps and on at least one side of the end of the first wiring layer; and
      a grounding conducting film on at least one side of the end of the first wiring layer with at least one of the first and second conducting film islands interposed between the end of the first wiring layer and the grounding conducting film;
   a second wiring having a first later on the dielectric substrate;
   a first wire having a firs end and a second end, the first end being connected to both of the end of the first wiring layer of the RF circuit chip and the first conducting film island, across one of the gaps, and the second end being connected to the second wiring layer; and
   a second wire having a first end and a second end, the first end being connected to both of the end of the first wiring layer of the RF circuit chip and the second conducting film island, across one of the gaps, and the second end being connected to the second wiring layer.

5. The FR circuit device according to claim 4, wherein the first and second conducting film islands form an open stub having a capacitance that substantially cancels parasitic inductance of the first and second wires.

* * * * *